United States Patent
Hur et al.

(10) Patent No.: US 10,491,176 B1
(45) Date of Patent: Nov. 26, 2019

(54) RECONFIGURABLE RADIO FREQUENCY (RF) POWER AMPLIFIER CIRCUIT

(71) Applicant: QUALCOMM INCORPORATED, San Diego, CA (US)

(72) Inventors: Joonhoi Hur, Cupertino, CA (US); Paul Draxler, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/138,657

(22) Filed: Sep. 21, 2018

(51) Int. Cl.
| | |
|---|---|
| *H03F 3/24* | (2006.01) |
| *H03F 1/02* | (2006.01) |
| *H03G 3/30* | (2006.01) |
| *H04B 1/04* | (2006.01) |
| *H03F 1/56* | (2006.01) |

(52) U.S. Cl.
CPC .............. *H03F 3/24* (2013.01); *H03F 1/0238* (2013.01); *H03F 1/56* (2013.01); *H03G 3/3042* (2013.01); *H04B 1/0458* (2013.01); *H03F 2200/45* (2013.01)

(58) Field of Classification Search
USPC ... 330/31, 51, 84, 96, 124 R, 148, 151, 229, 330/286, 295, 297, 302; 375/219, 238, 375/295–297; 455/91, 102, 126, 127.1, 455/127.4, 242.1
See application file for complete search history.

(56) References Cited

U.S. PATENT DOCUMENTS

| | | | |
|---|---|---|---|
| 6,297,696 B1 | 10/2001 | Abdollahian et al. | |
| 7,570,932 B1* | 8/2009 | Folkmann | H03F 1/0277 330/295 |
| 7,917,105 B2 | 3/2011 | Drogi et al. | |
| 8,280,323 B2 | 10/2012 | Thompson | |
| 8,314,654 B2* | 11/2012 | Outaleb | H03F 1/0288 330/124 R |
| 8,824,991 B2* | 9/2014 | Chang | H03F 3/19 330/129 |
| 9,484,865 B2 | 11/2016 | Kobayashi et al. | |
| 2015/0070097 A1* | 3/2015 | Bauer | H03F 1/0227 330/296 |
| 2017/0077877 A1* | 3/2017 | Anderson | B82Y 10/00 |

OTHER PUBLICATIONS

Hedayati H., et al., "A 2-GHz Highly Linear Efficient Dual-Mode BiCMOS Power Amplifier Using a Reconfigurable Matching Network", IEEE Journal of Solid-State Circuits, vol. 47, No. 10, Oct. 2012, pp. 2385-2404.

(Continued)

*Primary Examiner* — Shawkat M Ali
(74) *Attorney, Agent, or Firm* — Smith Tempel Blaha LLC/Qualcomm

(57) ABSTRACT

An amplifier circuit includes a first adjustable amplification path and a second adjustable amplification path; wherein the first adjustable amplification path and the second adjustable amplification path are configurable in different operating modes selected from a linear operating mode, an efficient operating mode, and an intermediate operating mode to amplify a transmission signal based at least in part on a characteristic of the transmission signal.

28 Claims, 7 Drawing Sheets

(56) References Cited

OTHER PUBLICATIONS

Rubio J.M., et al., "3-3.6-GHz Wideband GaN Doherty Power Amplifier Exploiting Output Compensation Stages", IEEE Transactions on Microwave Theory and Techniques, Aug. 2012, vol. 60, No. 8, pp. 2543-2548.

Zhang G., et al., "A High Performance Balanced Power Amplifier and Its Integration into a Front-end Module at PCS Band", IEEE Radio Frequency Integrated Circuits Symposium, 2007, pp. 251-254.

\* cited by examiner

RECONFIGURABLE RADIO FREQUENCY (RF) POWER AMPLIFIER CIRCUIT

FIELD

The present disclosure relates generally to electronics, and more specifically to power amplifiers.

BACKGROUND

In a radio frequency (RF) transceiver, a communication signal is typically amplified and transmitted by a transmit section. A transmit section may comprise one or more circuits that amplify and transmit the communication signal. The amplifier circuit or circuits may comprise one or more amplifier paths having one or more stages that may include one or more driver stages and one or more power amplifier stages. The amplifier circuit or circuits may generally be called upon to provide different levels of power amplification over a wide bandwidth, while attempting to provide both efficiency and linearity for a variety of different transmission signals. Often, providing a linear power output comes at the expense of efficiency, and providing high efficiency comes at the expense of linearity.

SUMMARY

Various implementations of systems, methods and devices within the scope of the appended claims each have several aspects, no single one of which is solely responsible for the desirable attributes described herein. Without limiting the scope of the appended claims, some prominent features are described herein.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

One aspect of the disclosure provides an amplifier circuit having a first adjustable amplification path and a second adjustable amplification path, wherein the first adjustable amplification path and the second adjustable amplification path are configurable in different operating modes selected from a linear operating mode, an efficient operating mode, and an intermediate operating mode to amplify a transmission signal based at least in part on a characteristic of the transmission signal.

Another aspect of the disclosure provides a method for communication including determining at least one characteristic of a transmission signal, and configuring an amplifier comprising a first adjustable amplification path and a second adjustable amplification path in different operating modes selected from a linear operating mode, an efficient operating mode, and an intermediate operating mode to amplify the transmission signal based at least in part on the characteristic of the transmission signal.

Another aspect of the disclosure provides a device including means for determining at least one characteristic of a transmission signal, first means for amplifying the transmission signal, second means for amplifying the transmission signal, an output of the first means for amplifying being coupled to an output of the second means for amplifying, and means for configuring the first means for amplifying and the second means for amplifying in different operating modes selected from a linear operating mode, an efficient operating mode, and an intermediate operating mode based at least in part on the characteristic of the transmission signal.

Another aspect of the disclosure provides an amplifier including a first adjustable amplification path and a second adjustable amplification path, and a reconfigurable isolator configured to selectively couple an adjustable resistance between an output of the first adjustable amplification path and an output of the second adjustable amplification path based at least in part on a characteristic of the transmission signal.

BRIEF DESCRIPTION OF THE DRAWINGS

In the figures, like reference numerals refer to like parts throughout the various views unless otherwise indicated. For reference numerals with letter character designations such as "102a" or "102b", the letter character designations may differentiate two like parts or elements present in the same figure. Letter character designations for reference numerals may be omitted when it is intended that a reference numeral encompass all parts having the same reference numeral in all figures.

DETAILED DESCRIPTION

The word "exemplary" is used herein to mean "serving as an example, instance, or illustration." Any aspect described herein as "exemplary" is not necessarily to be construed as preferred or advantageous over other aspects.

Exemplary embodiments of the disclosure are directed to a reconfigurable radio frequency (RF) power amplifier that can be configured to provide a variety of different amplification levels, including, for example, amplification levels having high linearity when efficiency requirements may be relaxed, amplification levels having high efficiency when linearity requirements are relaxed, and other amplification levels between those having high linearity and high efficiency. Tradeoffs towards linearity increase throughput and towards efficiency increase power, resulting in increased range.

Further, there are operating conditions when a power amplifier encounters time varying antenna mismatch during operation, in which case operating the power amplifier in a high linearity mode may overcome the time varying antenna mismatch condition.

In other situations, time varying antenna mismatch may not occur or may not cause operational problems, in which case operating the power amplifier in a high efficiency mode may be preferred.

Various technologies for operating an amplifier in a highly linear mode include, for example, a balanced amplifier architecture operating as a class A or class AB power amplifier; however, such an implementation may be inefficient, particularly for low EVM (error vector magnitude) waveforms.

Similarly, various technologies allow operation in a highly efficient mode (having for example, a relaxed EVM specification) including, for example, operating as a class AB power amplifier; however, such an implementation may not provide sufficient linearity at back-off power levels or over antenna mismatch conditions for some operating specifications, and some transmission signals.

Therefore, it would be desirable to have a way of operating a power amplifier in a high efficiency mode, in a highly linear mode, or in an intermediate mode ranging between a high efficiency mode and a highly linear mode depending, at least in part, on the type of transmission signal sought to be amplified, and, at least in part, on operating conditions, such as antenna mismatch conditions.

Figure 1:
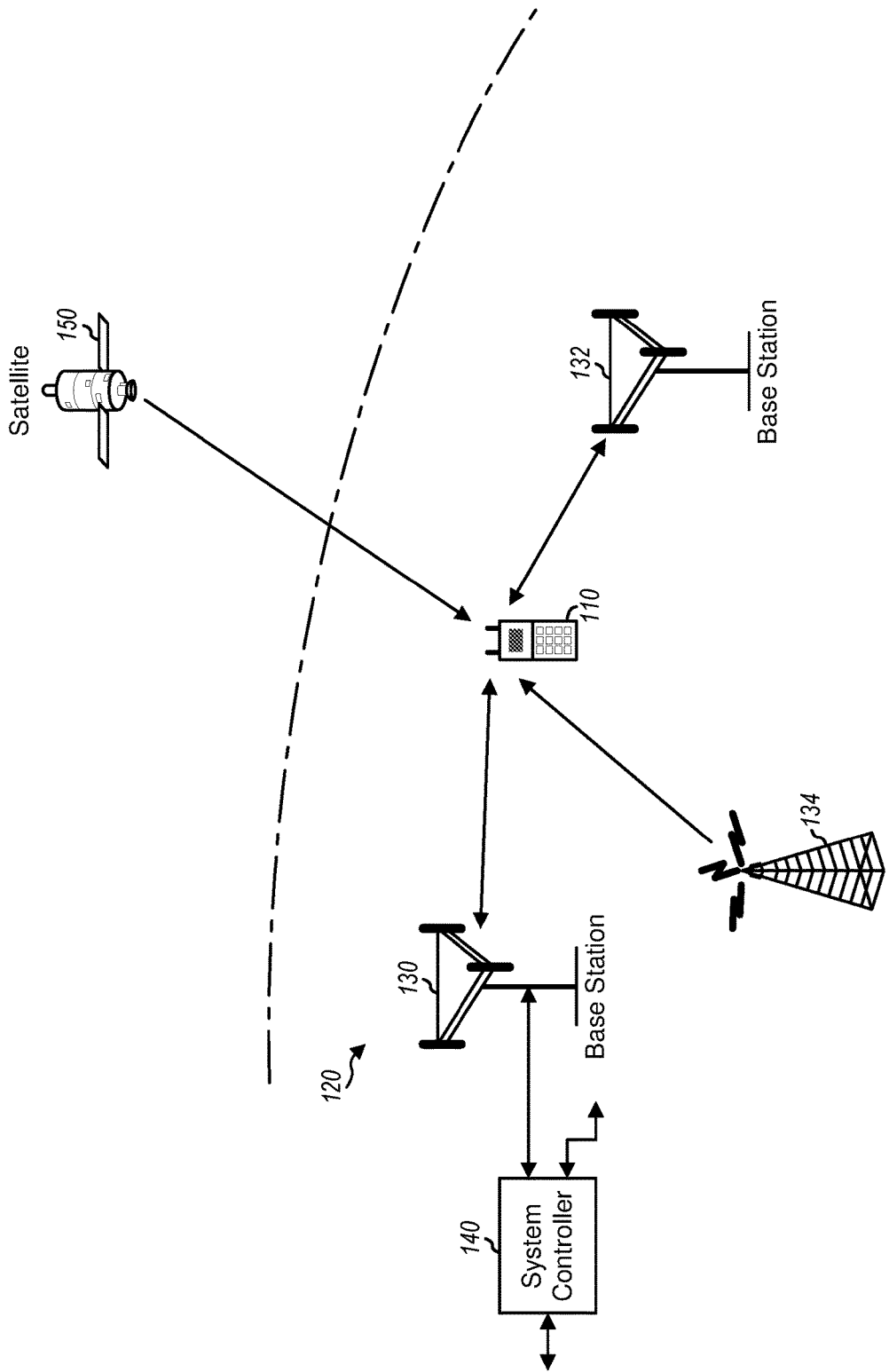
FIG. 1 is a diagram showing a wireless device communicating with a wireless communication system.

FIG. 1 is a diagram showing a wireless device 110 communicating with a wireless communication system 120. The wireless communication system 120 may be a Long Term Evolution (LTE) system, a Code Division Multiple Access (CDMA) system, a Global System for Mobile Communications (GSM) system, a wireless local area network (WLAN) system, a 5G system, or some other wireless system. A CDMA system may implement Wideband CDMA (WCDMA), CDMA 1x, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless communication system may include any number of base stations and any set of network entities.

The wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a tablet, a cordless phone, a medical device, a device configured to connect to one or more other devices (for example through the internet of things), a wireless local loop (WLL) station, a Bluetooth device, etc. Wireless device 110 may communicate with wireless communication system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1x, EVDO, TD-SCDMA, GSM, 802.11, 5G, etc.

Wireless device 110 may support carrier aggregation, which is operation on multiple carriers. Carrier aggregation may also be referred to as multi-carrier operation. Wireless device 110 may be able to operate in a variety of communication bands including, for example, those communication bands used by LTE, WiFi, 5G or other communication bands, over a wide range of frequencies.

In general, carrier aggregation (CA) may be categorized into two types—intra-band CA and inter-band CA. Intra-band CA refers to operation on multiple carriers within the same band. Inter-band CA refers to operation on multiple carriers in different bands.

Figure 2:
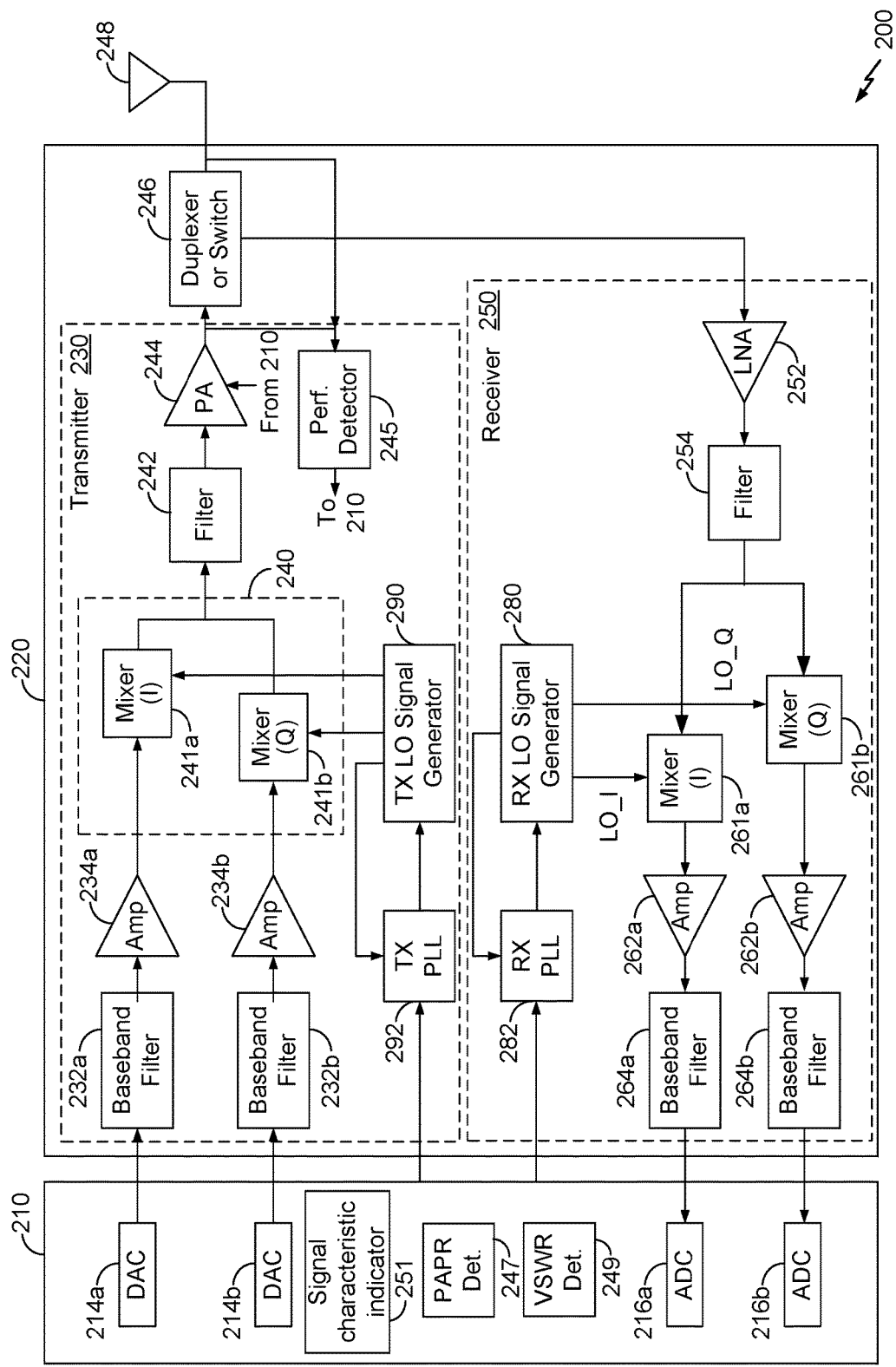
FIG. 2 is a block diagram showing a wireless device in which the exemplary techniques of the present disclosure may be implemented.

FIG. 2 is a block diagram showing a wireless device 200 in which the exemplary techniques of the present disclosure may be implemented. The wireless device 200 may, for example, be an embodiment of the wireless device 110 illustrated in FIG. 1.

FIG. 2 shows an example of a transceiver 220. In general, the conditioning of the signals in a transmitter 230 and a receiver 250 may be performed by one or more stages of amplifier, filter, upconverter, downconverter, etc. These circuit blocks may be arranged differently from the configuration shown in FIG. 2. Furthermore, other circuit blocks not shown in FIG. 2 may also be used to condition the signals in the transmitter 230 and receiver 250. Unless otherwise noted, any signal in FIG. 2, or any other figure in the drawings, may be either single-ended or differential. Some circuit blocks in FIG. 2 may also be omitted.

In the example shown in FIG. 2, wireless device 200 generally comprises a transceiver 220 and a data processor 210. The data processor 210 may include a memory (not shown) to store data and program codes, and may generally comprise analog and/or digital processing elements. The transceiver 220 includes a transmitter 230 and a receiver 250 that support bi-directional communication. In general, wireless device 200 may include any number of transmitters and/or receivers for any number of communication systems and frequency bands. All or a portion of the transceiver 220 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the example shown in FIG. 2, transmitter 230 and receiver 250 are implemented with the direct-conversion architecture.

In the transmit path, the data processor 210 processes data to be transmitted and provides in-phase (I) and quadrature (Q) analog output signals to the transmitter 230. In an exemplary embodiment, the data processor 210 includes digital-to-analog-converters (DAC's) 214a and 214b for converting digital signals generated by the data processor 210 into the I and Q analog output signals, e.g., I and Q output currents, for further processing. In other embodiments, the DACs 214a and 214b are included in the transceiver 220 and the data processor 210 provides data (e.g., for I and Q) to the transceiver 220 digitally.

Within the transmitter 230, lowpass filters 232a and 232b filter the I and Q analog transmit signals, respectively, to remove undesired images caused by the prior digital-to-analog conversion. Amplifiers (Amp) 234a and 234b amplify the signals from lowpass filters 232a and 232b, respectively, and provide I and Q baseband signals. An upconverter 240 upconverts the I and Q baseband signals with I and Q transmit (TX) local oscillator (LO) signals from a TX LO signal generator 290 and provides an upconverted signal. A filter 242 filters the upconverted signal to remove undesired images caused by the frequency upconversion as well as noise in a receive frequency band. A power amplifier (PA) 244 amplifies the signal from filter 242 to obtain the desired output power level and provides a transmit RF signal. The transmit RF signal is routed through a duplexer or switch 246 and transmitted via an antenna 248. While the examples discussed above utilize I and Q signals, those of skill in the art will understand that elements of the transceiver may be configured to utilize polar signals.

In an exemplary embodiment, a performance detector 245 may be coupled to one or more of the output of the PA 244 and the output of the duplexer or switch 246 to detect or otherwise determine one or more characteristics of the output signal. For example, the performance detector 245 may comprise one or more of a peak power detector, an average power detector, a peak to average power ratio (PAPR) detector, a voltage standing wave ratio (VSWR) detector, or another signal performance detector. In an exemplary embodiment, a PAPR detector 247 and a VSWR detector 249 are shown as exemplary embodiments of the performance detector 245, and are shown as being implemented in the data processor 210 for example purposes only.

In an exemplary embodiment, the performance detector 245 can be configured to receive a portion of the output of one or more of the power amplifier 244 and the duplexer or switch 246, and allow the data processor 210 to develop a control signal used to at least partially control the output of the power amplifier 244 based on one or more characteristics of the amplified signal output of the power amplifier 244 or duplexer or switch 246, such as the peak to average power ratio of the transmission signal, and/or the VSWR, or changing VSWR of the amplified signal. Further, some or all components of the performance detector 245, PAPR detector 247, or VSWR detector 249 may be located elsewhere, such as within the power amplifier 244, within the data processor 210, or elsewhere. In some embodiments, the PAPR detector 247 and/or the VSWR detector 249 are implemented in a chip including a microcontroller; the chip may be mounted on a PCB on which other RF front end elements (e.g., the duplexer or switch 246, filter 242 or 254, or other non-illustrated elements) are mounted and the microcontroller may be used to adjust the PA 244 and one or more of the other front end elements. In an exemplary embodiment, the PAPR detector 247 and/or the VSWR detector 249 may be configured to detect and determine one or more characteristics of a signal amplified by the power amplifier 244, and may be configured to allow the data processor 210 to develop a control signal configured to at least partially control the output of the power amplifier 244 based, at least in part, on the one or more characteristics of the signal.

In an exemplary embodiment, a characteristic of the signal may be sensed or otherwise determined based on a signal characteristic indicator 251. The signal characteristic indicator may be generated by and/or provided by the data processor 210 in some embodiments, in contrast to being detected at the output of the PA by the performance detector 245. For example, one or more characteristics of a transmission signal may be known based on the radio access technology (RAT) used for a particular signal, such as, whether the signal is a WiFi signal, an LTE signal, a 3G signal, a 4G signal, a 5G signal, etc. In such situations, the signal characteristic indicator 251 may be indicative of or used to determine at least some of the characteristics of the transmission signal.

In an exemplary embodiment, the EVM specification for the type of signal being amplified by the power amplifier 244 may be detected and determined so that the data processor 210 may develop a control signal to adjust the power amplifier 244 based, at least in part, on the EVM specification for the type of signal being amplified by the power amplifier 244. In an alternative embodiment, when the PAPR detector 247 may be located within the data processor 210, the PAPR detector 247 may provide one or more signals configured to allow the data processor 210 to generate a control signal to adjust the power amplifier 244 based, at least in part, on a characteristic of the type of signal being amplified, such as the EVM specification for the type of signal being amplified by the power amplifier 244.

In the receive path, antenna 248 receives communication signals and provides a received RF signal, which is routed through duplexer or switch 246 and provided to a low noise amplifier (LNA) 252. The duplexer 246 is designed to operate with a specific RX-to-TX duplexer frequency separation, such that RX signals are isolated from TX signals. The received RF signal is amplified by LNA 252 and filtered by a filter 254 to obtain a desired RF input signal. Downconversion mixers 261a and 261b mix the output of filter 254 with I and Q receive (RX) LO signals (i.e., LO_I and LO_Q) from an RX LO signal generator 280 to generate I and Q baseband signals. The I and Q baseband signals are amplified by amplifiers 262a and 262b and further filtered by lowpass filters 264a and 264b to obtain I and Q analog input signals, which are provided to data processor 210. In the exemplary embodiment shown, the data processor 210 includes analog-to-digital-converters (ADC's) 216a and 216b for converting the analog input signals into digital signals to be further processed by the data processor 210. In some embodiments, the ADCs 216a and 216b are included in the transceiver 220 and provide data to the data processor 210 digitally.

In FIG. 2, TX LO signal generator 290 generates the I and Q TX LO signals used for frequency upconversion, while RX LO signal generator 280 generates the I and Q RX LO signals used for frequency downconversion. Each LO signal is a periodic signal with a particular fundamental frequency. A phase locked loop (PLL) 292 receives timing information from data processor 210 and generates a control signal used to adjust the frequency and/or phase of the TX LO signals from LO signal generator 290. Similarly, a PLL 282 receives timing information from data processor 210 and generates a control signal used to adjust the frequency and/or phase of the RX LO signals from LO signal generator 280.

Wireless device 200 may support CA and may (i) receive multiple downlink signals transmitted by one or more cells on multiple downlink carriers at different frequencies and/or (ii) transmit multiple uplink signals to one or more cells on multiple uplink carriers. Those of skill in the art will understand, however, that aspects described herein may be implemented in systems, devices, and/or architectures that do not support carrier aggregation.

Certain elements of the transceiver 220 are functionally illustrated in FIG. 2, and the configuration illustrated therein may or may not be representative of a physical device configuration in certain implementations. For example, as described above, transceiver 220 may be implemented in various integrated circuits (ICs), RF ICs (RFICs), mixed-signal ICs, etc. In some embodiments, the transceiver 220 is implemented on a substrate or board such as a printed circuit board (PCB) having various modules. For example, the power amplifier 244, the filter 242, and the duplexer 246 may be implemented in separate modules or as discrete components, while the remaining elements illustrated in the transceiver 220 may be implemented in a single transceiver chip.

The power amplifier 244 may comprise one or more stages comprising, for example, driver stages, power amplifier stages, or other components, that can be configured to amplify a communication signal on one or more frequencies, in one or more frequency bands, and at one or more power levels. Depending on various factors, the power amplifier 244 can be configured to operate using one or more driver stages, one or more power amplifier stages, one or more impedance matching networks, and can be configured to provide linearity, efficiency, or a combination of linearity and efficiency.

In an exemplary embodiment of the present disclosure, a reconfigurable radio frequency (RF) power amplifier may be incorporated with or into the power amplifier 244 to provide RF power amplification. In a particular exemplary embodiment, a reconfigurable radio frequency (RF) power amplifier may be configured to provide one or more power amplification levels that prioritize linearity, efficiency, or a combination of linearity and efficiency. Those of skill in the art, however, will recognize that aspects of the reconfigurable radio frequency (RF) power amplifier described herein may be implemented in transmit architectures which differ from the architecture illustrated in FIG. 2 and may be implemented in other devices in which RF power amplification is desired.

It is generally desirable for a power amplifier circuit to provide linear power amplification over a desired bandwidth, which may be a wide bandwidth, support high data rate transmission, provide high efficiency over the desired power output range and bandwidth, and support multiple power modes. In some operating situations, time varying antenna mismatch may hamper linear operation, where for example, a 1% EVM (error vector magnitude) specification may not be able to be maintained in the presence of time varying antenna mismatch that exceeds a threshold. However, in other operating situations, time varying antenna mismatch may not hamper linear operation, where, for example, an EVM specification of 5-10%, may allow for more efficient amplifier operation.

As used herein, the term EVM refers to a measure of the difference between the measured waveform and the theoretical modulated waveform (the error vector) for a transmission signal. Both the measured waveform and the theoretical modulated waveform may be further modified by selecting the frequency, absolute phase, absolute amplitude and chip clock timing so as to minimize the error vector. In such embodiment, the EVM result may be defined as the square root of the ratio of the mean error vector power to the mean reference signal power expressed as a %.

Existing power amplifier architectures can be configured for highly efficient operation, such as class AB power amplifier operation, but such power amplifiers may be inefficient when amplifying low EVM waveforms (for example, waveforms having <5% EVM specification). For amplifying low EVM waveforms, a class AB power amplifier may provide high efficiency, but may not be able to provide sufficient linearity, nor provide linearity in the presence of time varying antenna mismatch. Time varying antenna mismatch may be characterized by, for example, a voltage standing wave ratio (VSWR) reflection coefficient at the antenna 248, which may be detected by the VSWR detector 249. In an exemplary embodiment, the VSWR detector 249 may be configured to detect and quantify time varying antenna mismatch by determining the VSWR at the antenna 248. In an exemplary embodiment, the VSWR detector 249 may be configured to provide a signal allowing the data processor 210 to develop a control signal that can be used to adjust the power amplifier 244 based, at least in part, on a characteristic of the signal being amplified, such as the EVM specification for the signal being amplified by the power amplifier 244 including any time varying antenna mismatch detected at the antenna 248.

In accordance with an exemplary embodiment, a reconfigurable RF power amplifier circuit may provide linearity, high efficiency, or a combination, or range of linearity and high efficiency based at least in part on one or more characteristics of the transmission signal sought to be amplified.

Figure 3:
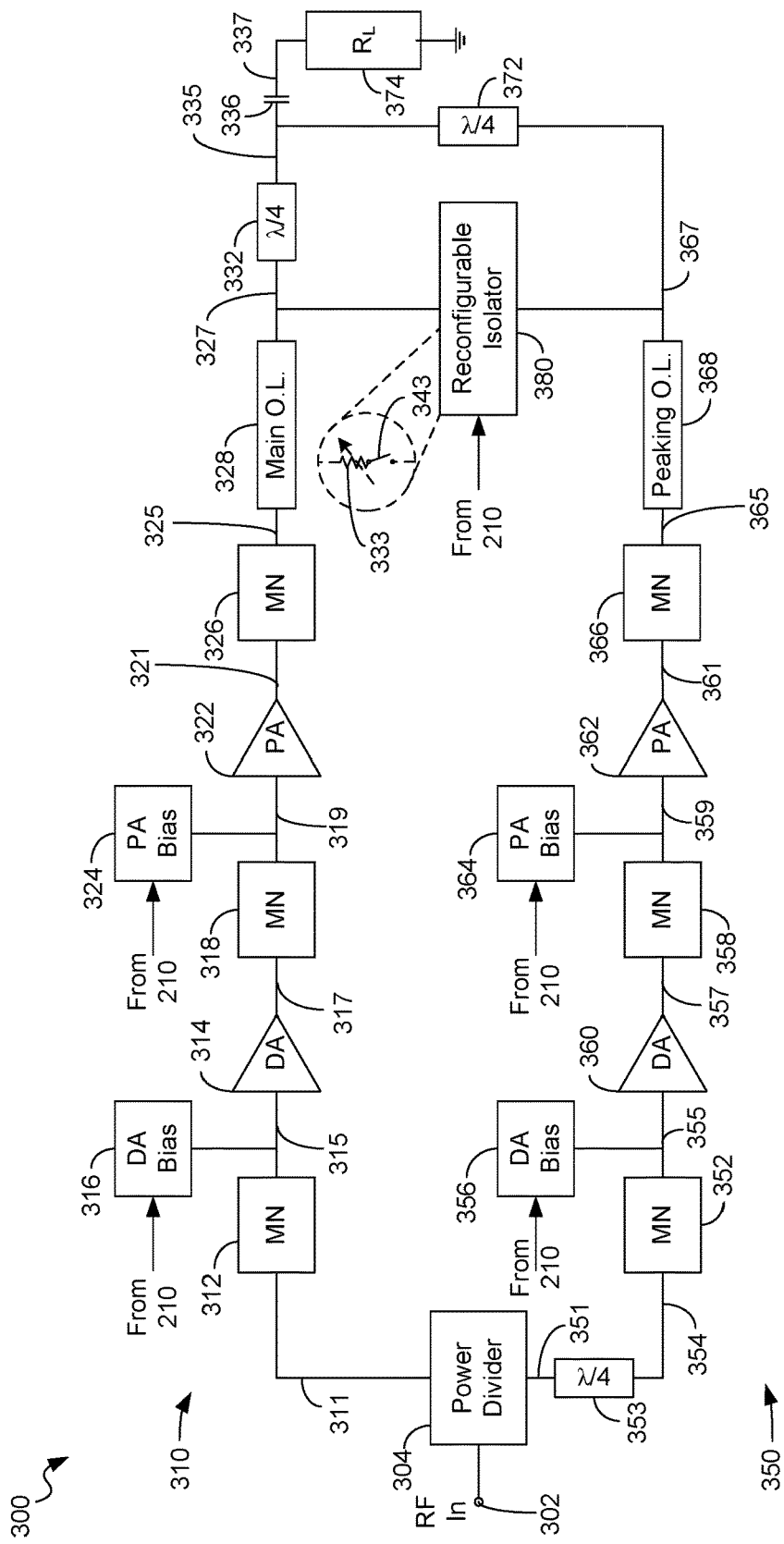
FIG. 3 is a schematic diagram illustrating an amplifier circuit in accordance with an exemplary embodiment of the disclosure.

FIG. 3 is a schematic diagram illustrating an amplifier circuit 300 in accordance with an exemplary embodiment of the disclosure. The amplifier circuit 300 may, for example, be an embodiment of or included within certain implementations of the PA 244 illustrated in FIG. 2.

In an exemplary embodiment, the amplifier circuit 300 comprises a radio frequency (RF) input terminal 302, over which an RF input signal (RF_in) may be provided to a power divider 304. The output of the power divider 304 may be provided to an upper path 310 and a lower path 350. In an exemplary embodiment, the upper path 310 may comprise an adjustable amplification path, and the lower path 350 may comprise an adjustable amplification path.

The upper path 310 comprises a matching network 312 and a driver amplifier (DA) 314. The matching network 312 may be referred to as an input matching network. The matching network 312 matches the impedance at the input of the driver amplifier 314 to the impedance of the RF input signal on connection 311. The matching network 312 may be a passive device, comprising one or more of resistances, capacitances and inductances, may be an active network comprising one or more active components, or may be a combination of passive and active components.

A driver amplifier (DA) bias circuit 316 may be coupled to the input of the driver amplifier 314 on connection 315 and may provide a bias signal (voltage and current) configured to bias the driver amplifier 314. The DA bias circuit 316 may receive a control signal from, for example, the data processor 210, the PAPR detector 247 or the VSWR detector 249 (FIG. 2).

An output of the driver amplifier 314 may be provided over connection 317 to a matching network 318. An output of the matching network 318 may be provided to a power amplifier (PA) 322. The matching network 318 may be referred to as an interstage matching network. The matching network 318 matches the impedance at the output of the driver amplifier 314 to the impedance at the input of the power amplifier 322. The matching network 318 may be a passive device, comprising one or more of resistances, capacitances and inductances, may be an active network comprising one or more active components, or may be a combination of passive and active components.

A power amplifier (PA) bias circuit 324 may be coupled to the input of the power amplifier 322 on connection 319 and may provide a bias signal (voltage and current) configured to bias the power amplifier 322. The PA bias circuit 324 may receive a control signal from, for example, the data processor 210, the PAPR detector 247 or the VSWR detector 249 (FIG. 2).

An output of the power amplifier 322 is provided over connection 321 to a matching network 326. The output of the matching network 326 is provided over connection 325 to a main offset line 328. In an exemplary embodiment, the main offset line 328 may be an inductive-capacitive (LC) circuit, or a transmission line, configured to determine or set an impedance at the load, $R_L$ 374. The output of the main offset line 328 is provided over connection 327 to a ¼ wave (λ/4) transmission line 332. An output of the ¼ wave transmission line 332 is provided over connection 335, through a capacitance 336, and over connection 337 to a load resistance ($R_L$) 374. The load resistance ($R_L$) 374 may represent the impedance at the input to the antenna (not shown in FIG. 3).

The matching network 326 may be referred to as an output matching network. The matching network 326 matches the impedance at the output of the power amplifier 322 to the impedance at the load resistance 374. The matching network 326 may be a passive device, comprising one or more of resistances, capacitances and inductances, or may be an active network comprising one or more active components.

The lower path 350 comprises a ¼ wave transmission line 353, the output of which may be provided over connection 354 to a matching network 352 and a driver amplifier (DA) 360. The matching network 352 may be referred to as an input matching network. The matching network 352 matches the impedance at the input of the driver amplifier 360 to the impedance of the RF input signal at the output of the ¼ wave transmission line 353 on connection 354. The matching network 352 may be a passive device, comprising one or more of resistances, capacitances and inductances, may be an active network comprising one or more active components, or may be a combination of passive and active components.

A driver amplifier (DA) bias circuit 356 may be coupled to the input of the driver amplifier 360 on connection 355 and may provide a bias signal (voltage and current) configured to bias the driver amplifier 360. The DA bias circuit 356 may receive a control signal from, for example, the data processor 210, or the PAPR detector 247 (FIG. 2).

An output of the driver amplifier 360 may be provided over connection 357 to a matching network 358. An output of the matching network 358 may be provided to a power amplifier (PA) 362. The matching network 358 may be referred to as an interstage matching network. The matching network 358 matches the impedance at the output of the driver amplifier 360 to the impedance at the input of the power amplifier 362. The matching network 358 may be a passive device, comprising one or more of resistances, capacitances and inductances, may be an active network comprising one or more active components, or may be a combination of passive and active components.

A power amplifier (PA) bias circuit 364 may be coupled to the input of the power amplifier 362 on connection 359 and may provide a bias signal (voltage and current) configured to bias the power amplifier 362. The PA bias circuit 364 may receive a control signal from, for example, the data processor 210, the PAPR detector 247 or the VSWR detector 249 (FIG. 2).

An output of the power amplifier 362 is provided over connection 361 to a matching network 366. The output of the matching network 366 is provided over connection 365 to a peaking offset line 368. In an exemplary embodiment, the peaking offset line 368 may be an inductive-capacitive (LC) circuit, or a transmission line, configured to determine or set an impedance at the load, $R_L$ 374. In an exemplary embodiment, the main offset line 328 and the peaking offset line 368 may be configured to establish a phase difference at their respective outputs on connections 327 and 367. The output of the peaking offset line 368 is provided over connection 367 to a ¼ wave (λ/4) transmission line 372. An output of the ¼ wave transmission line 372 is provided over the connection 335, through the capacitance 336, and over connection 337 to the load resistance ($R_L$) 374.

In an exemplary embodiment, a phase difference of 90 degrees may be created between the signals on connections 327 and 367; however, other values of phase difference between the signals on connections 327 and 367 are possible.

The matching network 366 may be referred to as an output matching network. The matching network 366 matches the impedance at the output of the power amplifier 362 to the impedance at the load resistance 374. The matching network 366 may be a passive device, comprising one or more of resistances, capacitances and inductances, may be an active network comprising one or more active components, or may be a combination of passive and active components.

A reconfigurable isolator 380 may be coupled to the output of the main offset line 328 on connection 327, and may be coupled to the output of the peaking offset line 368 on connection 367. The reconfigurable isolator 380 may receive a control signal from, for example, the data processor 210 (FIG. 2), and may be configured to resistively couple the output of the main offset line 328 on connection 327 to the output of the peaking offset line 368 on connection 367. In an exemplary embodiment, the reconfigurable isolator 380 may comprise one or more resistive elements 333 and one or more switches 343. In an exemplary embodiment, the reconfigurable isolator 380 may comprise a switchable and adjustable resistance that may be controlled by a control signal from, for example, the data processor 210 (FIG. 2), to controllably adjust the resistance of the reconfigurable isolator 380 and/or set the switch 343.

Linear Mode (Balanced Mode)

In an exemplary embodiment, the amplifier circuit 300 may be configured in a highly linear mode. In a highly linear mode, also referred to as a "balanced mode", the amplifier circuit 300 may include an implementation of the reconfigurable isolator 380 that may comprise a resistance that may be engaged (e.g., switch 343 closed) to create a resistive connection between connections 327 and 367, and the upper and lower paths 310 and 350 may be engaged, such that the driver amplifiers 314 and 360, and the power amplifiers 322 and 362 are configured for class AB operation and are both biased by the DA bias circuits 316 and 356, and the PA bias circuits 324 and 364, to provide signal amplification. In an exemplary embodiment, in this example, the reconfigurable isolator 380 forms a part of the matching network 326 and forms a part of the matching network 366 so that when switched in, it provides output matching in addition to the matching networks 326 and 366. In an exemplary embodiment, the reconfigurable isolator 380 may comprise a resistance of, for example, about 100 ohm (a). For example, to develop and amplify a signal that meets a 5G specification, such as a 256QAM (256 point quadrature amplitude modulation) signal, the total error vector magnitude (EVM) after the amplifier circuit 300 should exceed, for example, −37 dB including any time varying antenna mismatch. In an exemplary embodiment, the data processor 210 (FIG. 2) determines the characteristics of the signal being transmitted and can adjust the amplifier circuit 300 to provide for maximum linearity based on the characteristics of the signal being transmitted and any detected antenna mismatch. For example, in linear mode with antenna mismatch, excessive AM/PM conversion or gain expansion may limit the amount of data throughput with a highly linear signal. To compensate for the AM/PM conversion or gain expansion, the bias of the power amplifier 322 and the power amplifier 362 may be adjusted to improve linearity and enable higher throughput. For example, a shift in the peak to average power ratio detected by the PAPR detector 247 (FIG. 2) or the VSWR measured by the VSWR detector 249 can be used to develop a control signal to adjust the PA bias accordingly.

Semi-Load Modulation Mode (Intermediate Mode)

In an exemplary embodiment, the amplifier circuit 300 may be configured in a mode having characteristic performance located between the highly linear mode and a highly efficient mode. Such a mode may be referred to as a semi-load modulation mode, or an intermediate mode. In a semi-load modulation mode, the amplifier circuit 300 may include an implementation of the reconfigurable isolator 380 that may comprise a resistance having a value between, for example, 100Ω, which would be used for the linear mode (balanced mode), and infinite resistance (open circuit), which may be used for the load-modulation mode (efficiency mode), and which may be engaged to create a resistive connection between connections 327 and 367. In an exemplary embodiment, an example of the resistance provided by the reconfigurable isolator 380 in the semi-load modulation mode may be between 2*Ro and infinite resistance, where Ro is a resistance of the reconfigurable isolator 380. In an exemplary embodiment for a 50 ohm value of $R_L$ 374, the value of the reconfigurable isolator 380 may be between 100 ohm and infinite resistance, such as, for example, 200 ohm. For example, the processor 210 may provide a signal to the resistor 333 to adjust the resistor 333 to have such value. In this semi-load modulation mode, the upper and lower paths 310 and 350 may be engaged, such that the driver amplifiers 314 and 360, and the power amplifiers 322 and 362 are configured for class AB operation and are both providing signal amplification. For example, this semi-load modulation mode may be used to develop and amplify a signal that meets the 4G specification, which has a linearity specification that is easier to meet than the linearity specification of a 5G signal. For example, for a receiver to demodulate a 16QAM (16 point quadrature amplitude modulation) signal constellation, such as that used for a 4G communication signal, the EVM specification for a 4G communication signal may be, for example, −19 dB. In such an implementation, the data processor 210 (FIG. 2) can provide signal information to adjust the bias of the driver amplifiers 314 and 360, and the bias of the power amplifiers 322 and 362, and adjust the reconfigurable isolator 380 to provide a resistance of, for example, an amount between 100Ω and an open circuit, such as 200Ω, to operate the amplifier circuit 300 in the semi-load-modulation mode to transmit a 4G communication signal. Other levels of bias adjustment for the driver amplifiers 314 and 360, and the power amplifiers 322 and 362, and other values of the resistance provided by the reconfigurable isolator 380 are possible to amplify signals along a range of linearity and efficiency.

Load Modulation Mode/Efficiency Mode

In an exemplary embodiment, the amplifier circuit 300 may also be configured in a highly efficient mode. In a highly efficient mode, also referred to as a "load modulation mode", the amplifier circuit 300 may include an implementation of the reconfigurable isolator 380 that may be disengaged (e.g., switch 343 open), and the lower path 350 may be selectively disengaged by appropriate bias for low power signals, such that only the driver amplifier 314 and the power amplifier 322 are configured for class AB operation and provide signal amplification unless the signal level exceeds a threshold, above which the driver amplifier 360 and the power amplifier 362 also provide amplification. In an exemplary embodiment, the term "load modulation" refers to how the lower path 350 influences the upper path 310 when the lower path is off and the reconfigurable isolator 380 is disengaged. In this highly efficient mode, the driver amplifier 360 and the power amplifier 362 in the lower path 350 may be biased using an envelope bias circuit such that for signal levels below a threshold, they provide no amplification, and only provide amplification when the signal level exceeds the envelope bias threshold. For example, to develop and amplify a signal that meets the 3G specification, the linearity specification is more relaxed than for 5G and 4G signals. For example, a 3G communication signal may be a quadrature phase shift keying (QPSK) signal, and to decode a QPSK signal, the EVM specification may be, for example −16 dB. The amplifier circuit 300 can obtain information from the data processor 210 (FIG. 2) to be configured to enhance the power added efficiency (PAE) in such an implementation. In an exemplary embodiment, the load modulation mode is similar to a "Doherty" configuration in some respects, while the linear mode is similar to a balanced configuration. In the linear mode, the reconfigurable isolator 380 is used to reduce the additional distortion caused by antenna mismatch.

In an exemplary embodiment, one or more of the signal characteristic indicator 251, the performance detector 245, the PAPR detector 247 or the VSWR detector 249 (FIG. 2) may be configured to detect and determine which signal (3G, 4G, 5G, etc.) is being amplified and transmitted, and can be used along with the data processor 210 to configure the amplifier circuit accordingly.

Figure 4A:
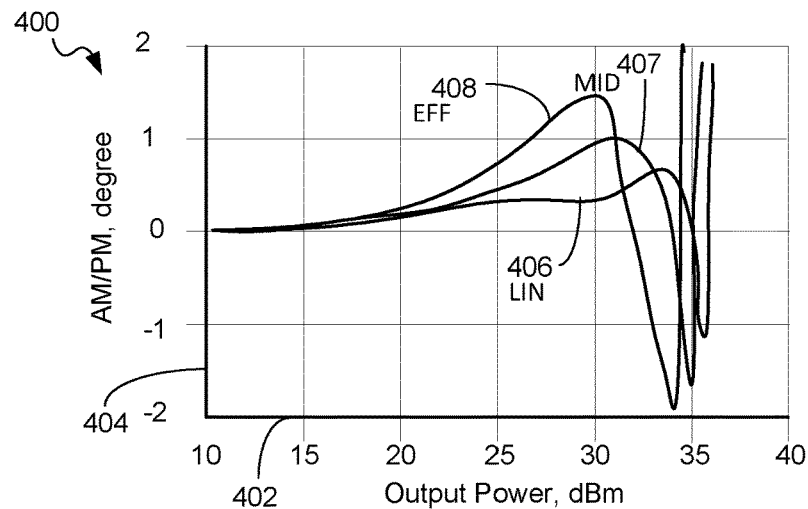
FIG. 4A is a graphical illustration showing amplitude modulation to phase modulation (AM/PM) conversion versus output power for an amplifier circuit operating in efficient mode, intermediate mode, and linear mode in accordance with an exemplary embodiment of the disclosure.

FIG. 4A is a graphical illustration 400 showing amplitude modulation to phase modulation (AM/PM) conversion versus output power for an amplifier circuit 300 operating in efficient mode, intermediate mode, and linear mode. The AM/PM conversion of an amplifier circuit is a measure of the amount of undesired deviation in phase modulation (PM) that is caused by amplitude variations (amplitude modulation (AM)) inherent in the amplifier circuit. The horizontal axis 402 shows output power in dBm, and the vertical axis 404 shows AM/PM, in degrees. The trace 406 represents exemplary AM/PM conversion for an amplifier circuit 300 when configured in linear mode (balanced mode), the trace 407 represents exemplary AM/PM conversion for the amplifier circuit 300 when configured in an intermediate mode (semi-load modulation mode), and the trace 408 represents exemplary AM/PM conversion for the amplifier circuit 300 when configured in efficient mode (load-modulation mode). As shown in FIG. 4A, the AM/PM conversion for the amplifier circuit 300 is better in linear mode than it is in the intermediate mode, and the AM/PM conversion for the amplifier circuit 300 is better in intermediate mode than it is in efficient mode.

Figure 4B:
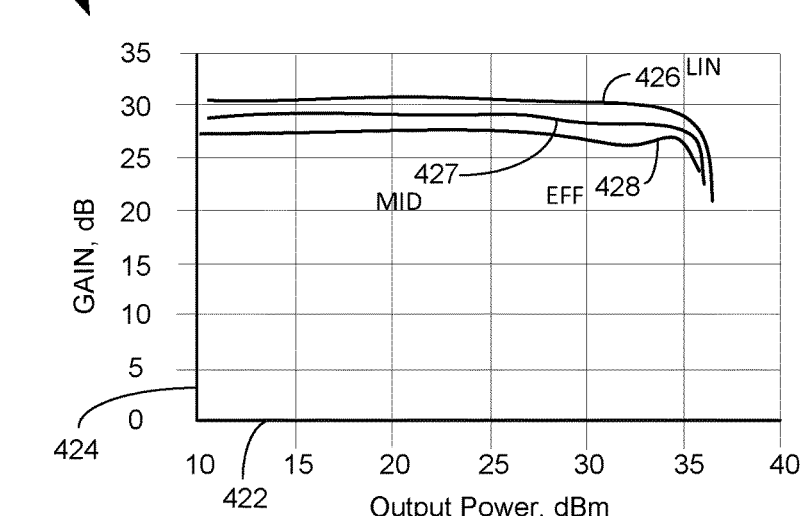
FIG. 4B is a graphical illustration showing amplifier gain for an amplifier circuit operating in efficient mode, intermediate mode, and linear mode in accordance with an exemplary embodiment of the disclosure.

FIG. 4B is a graphical illustration 420 showing amplifier gain for an amplifier circuit 300 operating in efficient mode, intermediate mode, and linear mode. The horizontal axis 422 shows output power in dBm, and the vertical axis 424 shows gain in dB. The trace 426 represents exemplary gain for an amplifier circuit 300 when configured in linear mode (balanced mode), the trace 427 represents exemplary gain for the amplifier circuit 300 when configured in intermediate mode (semi-load modulation mode), and the trace 428 represents exemplary gain for the amplifier circuit 300 when configured in efficient mode (load-modulation mode). As shown in FIG. 4B, the amplifier gain for the amplifier circuit 300 is better in linear mode than it is in the intermediate mode for a given output power, and the amplifier gain for the amplifier circuit 300 is better in intermediate mode than it is in efficient mode for a given output power.

Figure 4C:
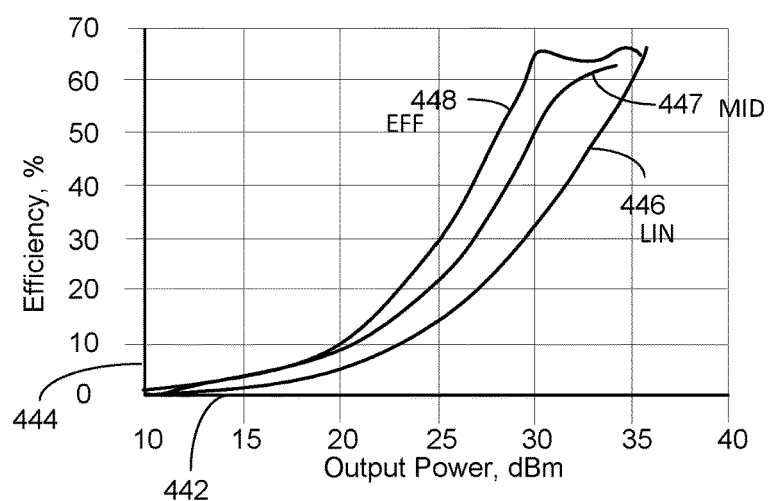
FIG. 4C is a graphical illustration showing efficiency for an amplifier circuit operating in efficient mode, intermediate mode, and linear mode in accordance with an exemplary embodiment of the disclosure.

FIG. 4C is a graphical illustration 440 showing efficiency for an amplifier circuit 300 operating in efficient mode, intermediate mode, and linear mode. The horizontal axis 442 shows output power in dBm, and the vertical axis 444 shows efficiency in %. The trace 446 represents exemplary efficiency for an amplifier circuit 300 when configured in linear mode(balanced mode), the trace 447 represents exemplary efficiency for the amplifier circuit 300 when configured in intermediate mode (semi-load modulation mode), and the trace 448 represents exemplary efficiency for the amplifier circuit 300 when configured in efficient mode (load-modulation mode). As shown in FIG. 4C, the amplifier efficiency for the amplifier circuit 300 is better in efficient mode than it is in the intermediate mode for a given output power, and the amplifier efficiency for the amplifier circuit 300 is better in intermediate mode than it is in linear mode for a given output power.

Figure 5A:
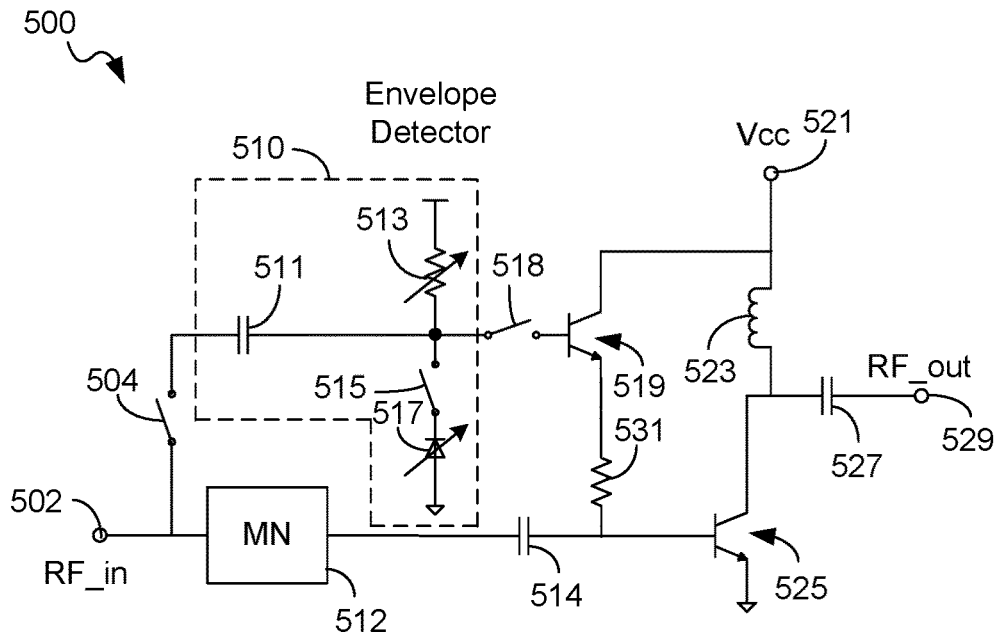
FIG. 5A is a schematic diagram illustrating an exemplary embodiment of an amplifier circuit in accordance with an exemplary embodiment of the disclosure.

FIG. 5A is a schematic diagram illustrating an exemplary embodiment of an amplifier circuit 500. In an exemplary embodiment, the amplifier circuit 500 comprises a radio frequency (RF) input terminal 502 at which an RF input signal (RF_in) is provided. In an exemplary embodiment, the amplifier circuit 500 also comprises an envelope detector, also referred to as an envelope bias circuit, 510, a bias transistor 519, and a power amplifier transistor 525. The envelope bias circuit 510 is an exemplary embodiment of any of the bias circuits in FIG. 3, and may be an exemplary embodiment of an instance of the DA bias circuit 356 and the PA bias circuit 364 when the amplifier circuit 300 is operating in load modulation (efficient) mode. A matching network 512 is shown for illustrative purposes only, and may be an exemplary embodiment of any of the matching networks shown in FIG. 3. A capacitor 514 is located between the matching network 512 and the power amplifier transistor 525. An input voltage, Vcc, is provided at connection 521 to a collector of the bias transistor 519, and through an inductor 523 to the collector of the power amplifier transistor 525. A radio frequency output signal, RF_out, is provided from the collector of the power amplifier transistor 525, through a capacitor 527 to the terminal 529. The emitter of the bias transistor 519 is coupled to the base of the power amplifier transistor 525 through a resistor 531.

A switch 504 and a switch 518 are controlled by, for example, signals generated by the data processor 210, to enable the envelope bias circuit 510 and to selectively couple the envelope bias circuit 510 to the driver amplifier 360 and to the power amplifier 362 in load modulation (efficient) mode. In an exemplary embodiment, the envelope bias circuit 510 comprises a capacitor 511, a variable resistance 513, a switch 515 and a variable diode 517. The variable resistance 513 and the variable diode 517 may be controlled by, for example, signals generated by the data processor 210. The envelope bias circuit 510 is configured to provide a bias signal to the power amplifier transistor 525 based at least in part, on the level of the RF input signal, RF_in on connection 502. In an exemplary embodiment, the envelope bias circuit 510 may be used in a high efficiency (load-modulation) mode, where the lower path 350 may be generally off for low power signals but active for signals that exceed a threshold.

Figure 5B:
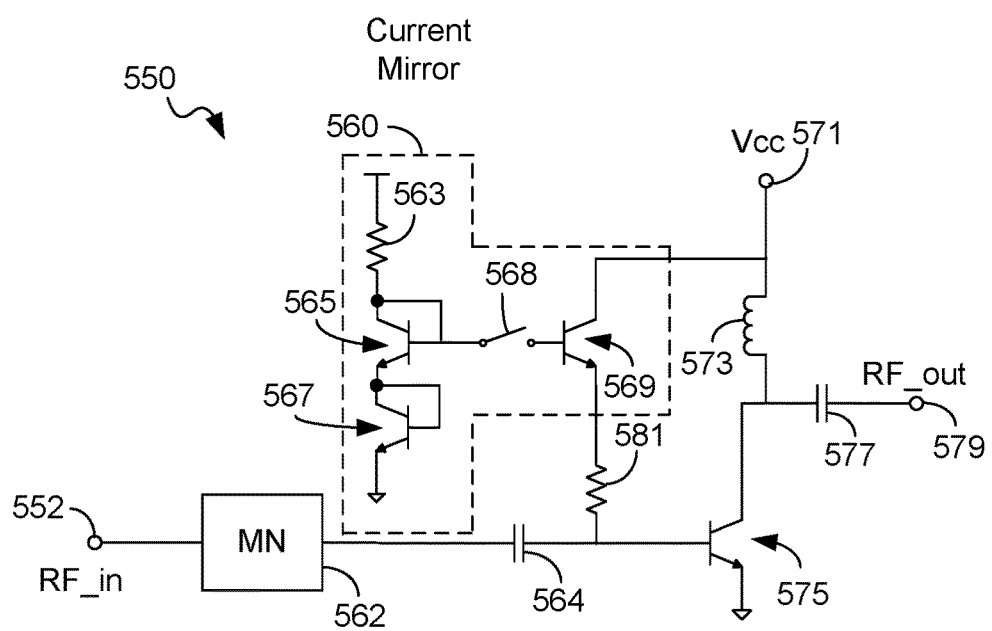
FIG. 5B is a schematic diagram illustrating an exemplary embodiment of an amplifier circuit in accordance with an exemplary embodiment of the disclosure.

FIG. 5B is a schematic diagram illustrating an exemplary embodiment of an amplifier circuit 550. The amplifier circuit 550 comprises a radio frequency (RF) input terminal 552 at which an RF input signal (RF_in) is provided. In an exemplary embodiment, the amplifier circuit 550 also comprises a current mirror bias circuit 560, a bias transistor 569, and a power amplifier transistor 575. The current mirror bias circuit 560 is an exemplary embodiment of any of the bias circuits in FIG. 3, and may be an exemplary embodiment of an instance of the DA bias circuit 316, PA bias circuit 324, DA bias circuit 356 and the PA bias circuit 364 when the amplifier circuit 300 is operating in linear (balanced) mode and in semi-load modulation (intermediate) mode. A matching network 562 is shown for illustrative purposes only, and may be an exemplary embodiment of any of the matching networks shown in FIG. 3. A capacitor 564 is located between the matching network 562 and the power amplifier transistor 575. An input voltage, Vcc, is provided at connection 571 to a collector of the bias transistor 569, and through an inductor 573 to the collector of the power amplifier transistor 575. A radio frequency output signal, RF_out, is provided from the collector of the power amplifier transistor 575, through a capacitor 577 to the terminal 579. The emitter of the bias transistor 569 is coupled to the base of the power amplifier transistor 575 through a resistor 581.

A switch 568 is controlled by, for example, a signal from the data processor 210, to enable the current mirror bias circuit 560 and to selectively couple the current mirror bias circuit 560 to the driver amplifier 314, power amplifier 322, driver amplifier 360 and to the power amplifier 362 in linear (balanced) mode and in semi-load modulation (intermediate) mode. In an exemplary embodiment, the current mirror bias circuit 560 comprises a resistance 563, a transistor 565 configured as a diode, and a transistor 567 also configured as a diode. Although shown as two diode connected transistors, a single diode connected transistor may also be used. The current mirror bias circuit 560 is configured to provide a bias signal to the power amplifier transistor 575 based at least in part, on the amount of current in the transistors 565 and 567. In an exemplary embodiment, instances of the current mirror bias circuit 560 may be used in a high linear mode (balanced mode), and a semi-load modulation mode (intermediate mode) to bias the driver amplifier 314, power amplifier 322, driver amplifier 360 and power amplifier 362, where the upper path 310 and the lower path 350 may be generally on and providing signal amplification. In an exemplary embodiment, in load modulation (efficient) mode, instances of the current mirror bias circuit 560 may be used to bias the driver amplifier 314 and the power amplifier 322, while instances of the envelope bias circuit 510 may be used to bias the driver amplifier 360 and the power amplifier 362. Thus, while FIGS. 5A and 5B individually illustrate bias circuits 510 and 560, respectively, both bias circuits may be implemented and selectively couplable to one or more elements of the amplifier circuit 300. For example, as described above, both the bias circuit 510 and the bias circuit 560 may be couplable to the driver amplifier 360 and/or the power amplifier 362 depending on mode.

Figure 6:
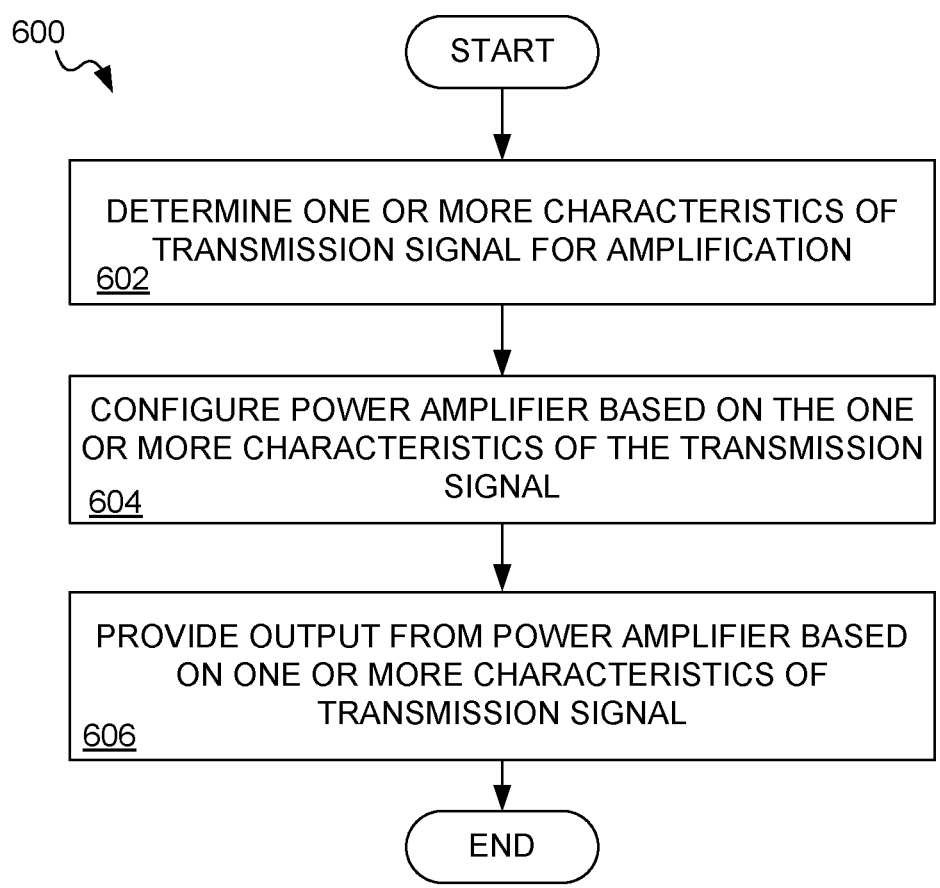
FIG. 6 is a flow chart describing the operation of an exemplary embodiment of an amplifier circuit in accordance with an exemplary embodiment of the disclosure.

FIG. 6 is a flow chart 600 describing the operation of an exemplary embodiment of an amplifier circuit in accordance with an exemplary embodiment of the disclosure. The blocks in the method 600 can be performed in or out of the order shown, and in some embodiments, can be performed at least in part in parallel.

In block 602, one or more characteristics of a transmission signal are determined. For example, a type of transmission signal (3G, 4G, 5G, etc.) may be determined by the data processor 210 (e.g., the signal characteristic indicator 251) (FIG. 2). Alternatively, a target EVM specification of the transmission signal may be determined by the PAPR detector 247.

In block 604, a power amplifier may be configured to provide power amplification based on the one or more characteristics of the transmission signal determined in block 602. For example, the amplifier circuit 300 (FIG. 3), may be configured for signal amplification based at least in part on the one or more characteristics of the transmission signal. For example, the DA bias circuit 316, the DA bias circuit 356, the PA bias circuit 324 and/or the PA bias circuit 364, along with the reconfigurable isolator 380 may be adjusted or otherwise configured to provide signal amplification based at least in part on the one or more characteristics of the transmission signal.

In block 606, the power amplifier provides an amplified signal output based at least in part on the one or more characteristics of the transmission signal.

Figure 7:
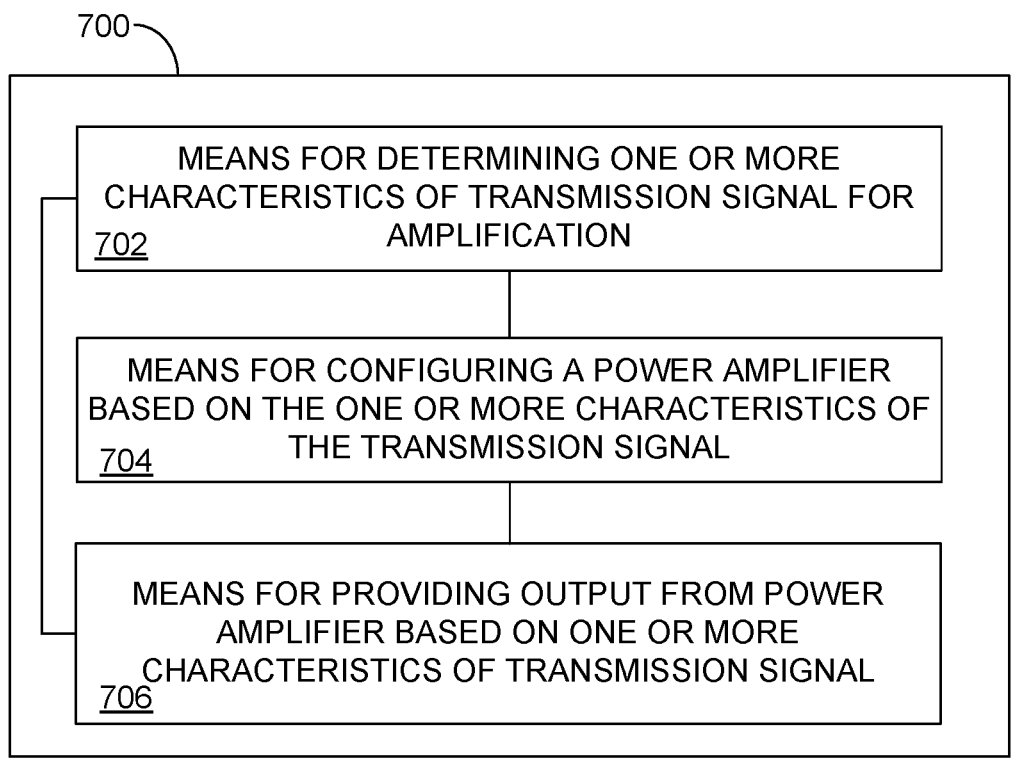
FIG. 7 is a functional block diagram of an apparatus for an amplifier circuit in accordance with an exemplary embodiment of the disclosure.

FIG. 7 is a functional block diagram of an apparatus 700 for an amplifier circuit in accordance with an exemplary embodiment of the disclosure. The apparatus 700 comprises means 702 for determining one or more characteristics of a transmission signal. In certain embodiments, the means 702 for determining one or more characteristics of a transmission signal can be configured to perform one or more of the function described in operation block 602 of method 600 (FIG. 6). In an exemplary embodiment, the means 702 for determining one or more characteristics of a transmission signal may comprise the data processor 210 (e.g., the signal characteristic indicator 251) and/or one or more of the performance detector 245 and the PAPR detector 247.

The apparatus 700 further comprises means 704 for configuring a power amplifier based on the one or more characteristics of the transmission signal. In certain embodiments, the means 704 for configuring a power amplifier based on the one or more characteristics of the transmission signal can be configured to perform one or more of the function described in operation block 604 of method 600 (FIG. 6). In an exemplary embodiment, the means 704 for configuring a power amplifier based on the one or more characteristics of the transmission signal may comprise the amplifier circuit 300 being configured to provide signal amplification based at least in part on the one or more characteristics of the transmission signal. In an exemplary embodiment, the DA bias circuit 316, the DA bias circuit 356, the PA bias circuit 324, and the PA bias circuit 364 may be configured to bias the driver amplifier 314, the driver amplifier 360, the power amplifier 322 and the power amplifier 362 to provide signal amplification, and the reconfigurable isolator 380 may be configured to provide selectable signal isolation based at least in part on the one or more characteristics of the transmission signal.

The apparatus 700 further comprises means 706 for providing an amplified signal output based at least in part on the one or more characteristics of the transmission signal. In certain embodiments, the means 706 for providing an amplified signal output based at least in part on the one or more characteristics of the transmission signal can be configured to perform one or more of the function described in operation block 606 of method 600 (FIG. 6). In an exemplary embodiment, the means 706 for providing an amplified signal output based at least in part on the one or more characteristics of the transmission signal may comprise one or more elements of the upper path 310 and the lower path 350, and/or output and/or transmission line(s), for example 328, 368, 332, and/or 372.

The amplifier circuit described herein described herein may be implemented on one or more ICs, analog ICs, RFICs, mixed-signal ICs, ASICs, printed circuit boards (PCBs), electronic devices, etc. The amplifier circuit described herein may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the amplifier circuit described herein described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

As used in this description, the terms "component," "database," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

Although selected aspects have been illustrated and described in detail, it will be understood that various substitutions and alterations may be made therein without departing from the spirit and scope of the present invention, as defined by the following claims.

What is claimed is:

1. An amplifier circuit, comprising:
   a first adjustable amplification path and a second adjustable amplification path;
   wherein the first adjustable amplification path and the second adjustable amplification path are configurable in different operating modes selected from a linear operating mode, an efficient operating mode, and an intermediate operating mode to amplify a transmission signal based at least in part on a characteristic of the transmission signal.

2. The amplifier circuit of claim 1, further comprising a reconfigurable isolation circuit configured to selectively resistively couple an output of the first adjustable amplification path to an output of the second adjustable amplification path in the linear operating mode.

3. The amplifier circuit of claim 1, further comprising a reconfigurable isolation circuit configured to selectively isolate an output of the first adjustable amplification path from an output of the second adjustable amplification path in the efficient operating mode.

4. The amplifier circuit of claim 1, further comprising a peak to average power ratio (PAPR) detector configured to determine the characteristic of the transmission signal and develop a control signal to configure the amplifier circuit in one of the linear operating mode, the efficient operating mode, and the intermediate operating mode.

5. The amplifier circuit of claim 1, further comprising:
   an adjustable driver amplifier bias circuit for a driver amplifier and an adjustable power amplifier bias circuit for a power amplifier in each of the first adjustable amplification path and second adjustable amplification path, the adjustable driver amplifier bias circuit and the adjustable power amplifier bias circuit responsive to the characteristic of the transmission signal.

6. The amplifier circuit of claim 1, wherein the characteristic of the transmission signal comprises a communication signal error vector magnitude value.

7. The amplifier circuit of claim 6, wherein the characteristic of the transmission signal comprising the communication signal error vector magnitude value is influenced by antenna mismatch at an output of the amplifier circuit.

8. A method for communication, comprising:
   determining at least one characteristic of a transmission signal; and
   configuring an amplifier comprising a first adjustable amplification path and a second adjustable amplification path in different operating modes selected from a linear operating mode, an efficient operating mode, and an intermediate operating mode to amplify the transmission signal based at least in part on the characteristic of the transmission signal.

9. The method of claim 8, further comprising resistively coupling an output of the first adjustable amplification path to an output of the second adjustable amplification path in the linear operating mode.

10. The method of claim 8, further comprising isolating an output of the first adjustable amplification path from an output of the second adjustable amplification path in the efficient operating mode.

11. The method of claim 8, further comprising:
    determining a peak to average power ratio (PAPR) of the transmission signal to determine the characteristic of the transmission signal; and
    generating a control signal to configure the amplifier in one of the linear operating mode, the efficient operating mode, and the intermediate operating mode.

12. The method of claim 8, further comprising adjusting a bias of a driver amplifier and adjusting a bias of a power amplifier responsive to the characteristic of the transmission signal.

13. The method of claim 8, wherein the characteristic of the transmission signal comprises a communication signal error vector magnitude value.

14. The method of claim 13, wherein the characteristic of the transmission signal comprising the communication signal error vector magnitude value is influenced by antenna mismatch at an output of the amplifier.

15. A device, comprising:
    means for determining at least one characteristic of a transmission signal;
    first means for amplifying the transmission signal;
    second means for amplifying the transmission signal, an output of the first means for amplifying being coupled to an output of the second means for amplifying; and
    means for configuring the first means for amplifying and the second means for amplifying in different operating modes selected from a linear operating mode, an efficient operating mode, and an intermediate operating mode based at least in part on the characteristic of the transmission signal.

16. The device of claim 15, further comprising:
    means for selectively resistively coupling the output of the first means for amplifying to the output of the second means for amplifying in the linear operating mode.

17. The device of claim 15, further comprising:
    means for selectively isolating the output of the first means for amplifying from the output of the second means for amplifying in the efficient operating mode.

18. The device of claim 15, further comprising:
    means for determining a peak to average power ratio (PAPR) of the transmission signal to determine the characteristic of the transmission signal; and
    means for developing a control signal to configure the device in one of the linear operating mode, the efficient operating mode, and the intermediate operating mode.

19. The device of claim 15, further comprising:
    means for adjusting a bias of a driver amplifier and means for adjusting a bias of a power amplifier responsive to the characteristic of the transmission signal.

20. The device of claim 15, wherein the characteristic of the transmission signal comprises a communication signal error vector magnitude value.

21. The device of claim 20, wherein the characteristic of the transmission signal comprising the communication signal error vector magnitude value is influenced by antenna mismatch at an output of the device.

22. An amplifier, comprising:
- a first adjustable amplification path and a second adjustable amplification path; and
- a reconfigurable isolator configured to selectively couple an adjustable resistance between an output of the first adjustable amplification path and an output of the second adjustable amplification path based at least in part on a characteristic of the transmission signal.

23. The amplifier of claim 22, wherein the reconfigurable isolator is configured to selectively resistively couple the output of the first adjustable amplification path to the output of the second adjustable amplification path in a linear operating mode.

24. The amplifier of claim 22, wherein the reconfigurable isolator is configured to selectively isolate the output of the first adjustable amplification path from the output of the second adjustable amplification path in an efficient operating mode.

25. The amplifier of claim 22, further comprising a peak to average power ratio (PAPR) detector configured to determine the characteristic of the transmission signal and develop a control signal to configure the amplifier in one of a linear operating mode, an efficient operating mode, and an intermediate operating mode.

26. The amplifier of claim 22, further comprising:
- an adjustable driver amplifier bias circuit for a driver amplifier and an adjustable power amplifier bias circuit for a power amplifier in each of the first adjustable amplification path and second adjustable amplification path, the adjustable driver amplifier bias circuit and the adjustable power amplifier bias circuit responsive to the characteristic of the transmission signal.

27. The amplifier of claim 22, wherein the characteristic of the transmission signal comprises a communication signal error vector magnitude value.

28. The amplifier of claim 27, wherein the characteristic of the transmission signal comprising the communication signal error vector magnitude value is influenced by antenna mismatch at an output of the amplifier.

* * * * *